United States Patent [19]

Kawade

[11] Patent Number: 5,241,145
[45] Date of Patent: Aug. 31, 1993

[54] OPERATION DEVICE FOR ELECTRONIC APPARATUS

[75] Inventor: Takaaki Kawade, Tokyo, Japan

[73] Assignee: Canon Kabushiki Kaisha, Tokyo, Japan

[21] Appl. No.: 674,945

[22] Filed: Mar. 26, 1991

[30] Foreign Application Priority Data

Apr. 4, 1990 [JP] Japan .................................. 2-88169

[51] Int. Cl.⁵ ............................................ H01H 13/14
[52] U.S. Cl. .................................... 200/530; 200/284
[58] Field of Search ............... 200/520, 530, 534, 532, 200/535, 243, 245, 292, 283, 284, 341, 310, 317, 313, 516, 517, 511

[56] References Cited

U.S. PATENT DOCUMENTS

| | | | |
|---|---|---|---|
| 3,950,627 | 4/1976 | Murata et al. | 200/511 X |
| 4,066,851 | 1/1978 | White et al. | 200/292 X |
| 4,417,114 | 11/1983 | Larson | 200/317 |
| 4,449,024 | 5/1984 | Stracener | 200/317 |
| 4,496,803 | 1/1985 | Smith | 200/532 X |
| 4,659,881 | 4/1987 | Dowe | 200/516 X |
| 4,837,412 | 6/1989 | Tachibara | 200/292 X |
| 4,920,342 | 4/1990 | Gratke | 200/292 X |

Primary Examiner—Henry J. Recla
Assistant Examiner—Glenn T. Barrett
Attorney, Agent, or Firm—Fitzpatrick, Cella, Harper & Scinto

[57] ABSTRACT

An operation device for an electronic apparatus comprises an indication board, a plurality of electric elements arranged at predetermined parts of the indication board, and a frame having a plurality of elastic pushing members formed in positions corresponding to the electric elements respectively. The surface of each of the pushing members is provided with a conductor part which is connected to an electrical wiring provided on the frame. Each of the electric elements is sandwiched and carried, with electrical connection, between the indication board and the frame.

2 Claims, 8 Drawing Sheets

OPERATION DEVICE FOR ELECTRONIC APPARATUS

BACKGROUND OF THE INVENTION

1. Field of the Invention

This invention relates to the operation device for an electronic apparatus which is provided for operating the internal electronic circuits of the apparatus and has electric elements such as a light emitting element, a display element, a push-button switch, a switch key, a connector, etc.

2. Description of the Related Art

Figure 10:
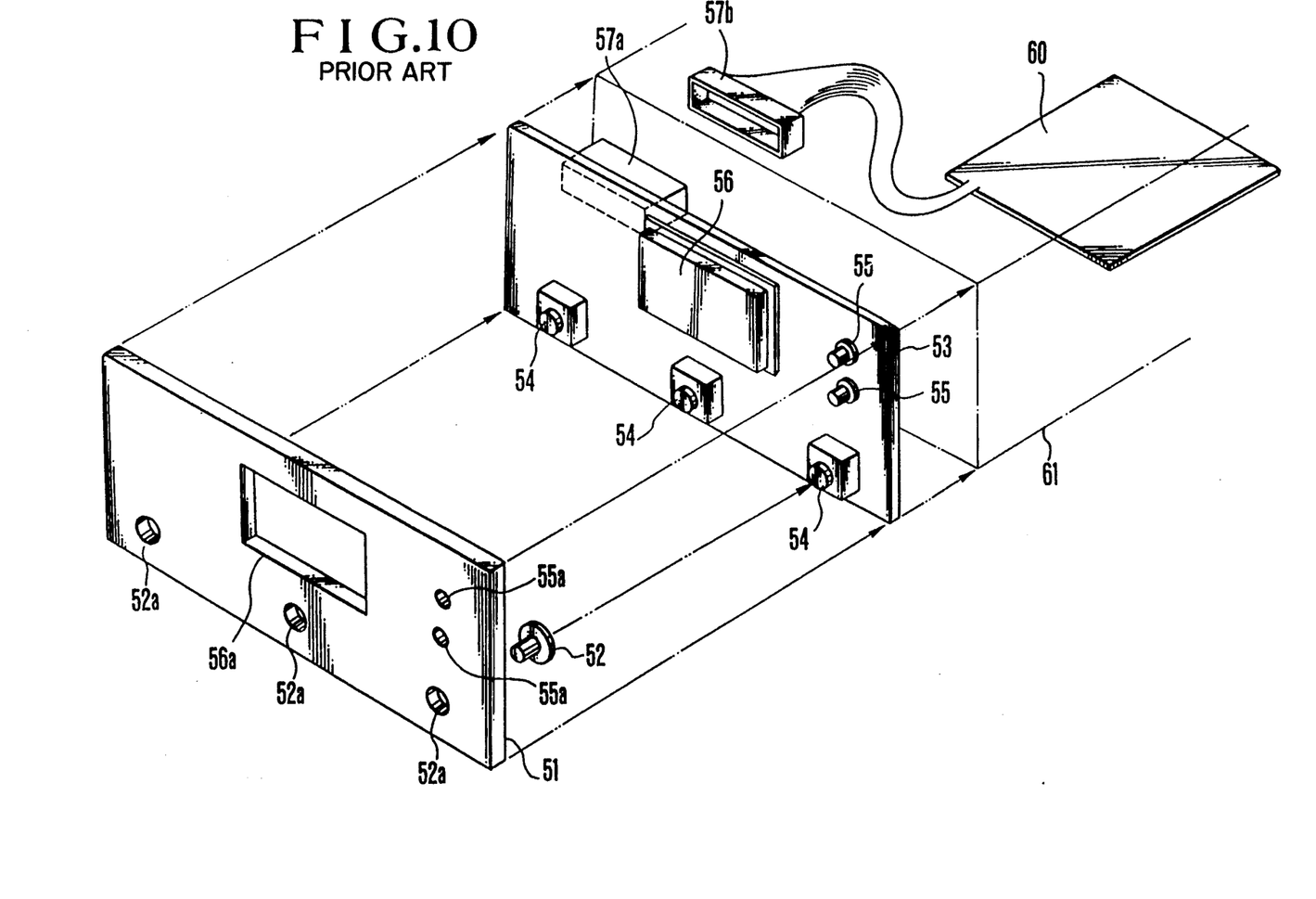
FIG. 10 is an exploded oblique view showing the conventional operation device for an electronic apparatus.

FIG. 10 of the accompanying drawings shows by way of example the arrangement of the conventional operation device for an electronic apparatus. The operation device for the electronic apparatus is formed as follows: Electric elements including LEDs (light emitting elements) 55, an LCD (a display element) 56, push-button switches 54 and a circuit-board connector 57a are mounted by soldering on a circuit board 53. An indication board 51 is secured to the circuit board 53 by inserting from the reverse side thereof the LEDs 55, the LCD 56 and switch keys 52 respectively into LED holes 55a, an LCD hole 56a and switch-key holes 52a provided in the indication board 51. Then, the circuit board 53 is mounted on the body 61 of the electronic apparatus while connecting the circuit-board connector 57a to a connector 57b which is disposed on the body 61.

Figure 11A:
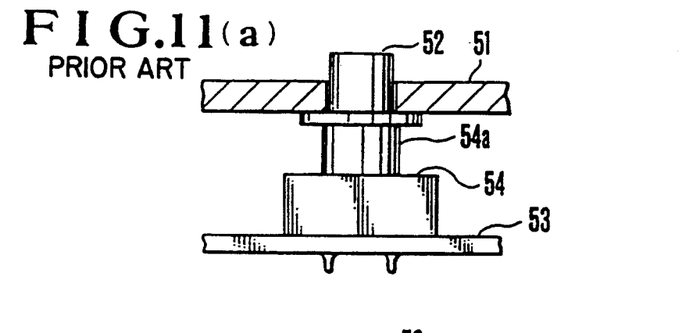
FIGS. 11(a) and 11(b) show the conventional mounting of the push-button switch.
Figure 11B:
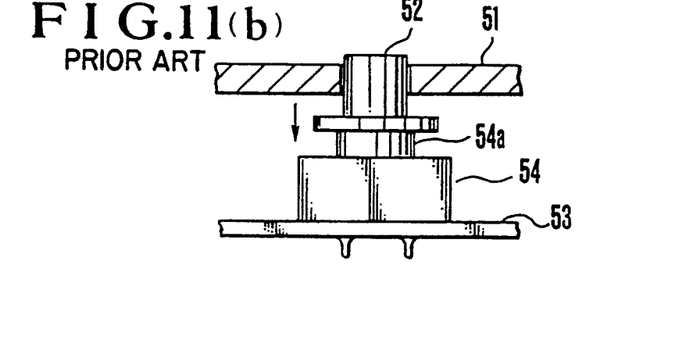

As shown in FIG. 11(a), the push-button switches 54 which are soldered to the circuit board 53 are electrically connected to an electric wiring (not shown) formed on the circuit board 53. The pushing part 54a of each of the push-button switches 54 is arranged to push each of the switch keys 52 against the indication board 51. When the switch key 52 is pushed by the operator, the pushing part 54a is pushed, as shown in FIG. 11(b), into the inner part of the push-button switch 54.

Figure 12:
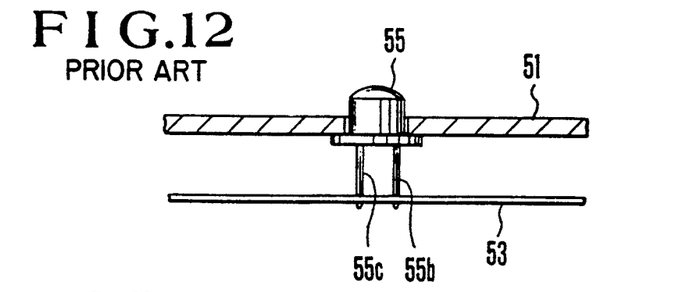
FIG. 12 shows the conventional mounting of the LED.

Referring to FIG. 12, the LEDs 55 which are mounted on the circuit board 53 with the fore end parts of their lead wires 55b and 55c soldered to the circuit board 53 are electrically connected to the above-stated electric wiring. Each of the LEDs 55 is thus mounted in a state of being buoyed up as much as the length of the lead wires 55b and 55c from the circuit board 53.

Figure 13:
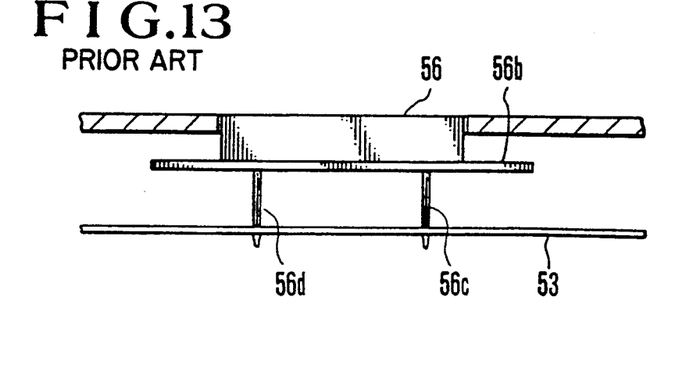
FIG. 13 shows the conventional mounting of the LCD.

As shown in FIG. 13, the LCD 56 has an LCD-control circuit board 56b which is provided with legs 56c and 56d. The fore end parts of the legs 56c and 56d are soldered to the circuit board 53. The LCD 56 is thus mounted in a state of being buoyed up as much as the length of the legs 56c and 56d from the circuit board 53. The electric connection of the LCD 56 with the above-stated electric wiring is effected either by soldering these legs or by means of a connector provided solely for the LCD 56.

In the conventional operation device for the electronic apparatus described above, a plurality of electric elements must be electrically connected to the electric wiring formed on the circuit board. They are soldered to the circuit board before mounting the indication board. However, these electric elements are mounted in a buoyed state away from the circuit board. Therefore, the electric elements tend to deviate from their positions. In securing the indication board to the circuit board, it is difficult to adjust these electric elements to their predetermined positions on the indication board. They cannot be readily inserted, for example, into the applicable holes of the indication board. This degrades the efficiency of assembly work.

SUMMARY OF THE INVENTION

This invention is directed to the solution of the above-stated problem. It is, therefore, a principal object of the invention to provide an operation device for an electronic apparatus which is arranged to permit electric elements to be easily mounted on an indication board without necessitating soldering work.

The above and other objects and features of this invention will become apparent from the following detailed description of embodiments thereof taken in connection with the accompanying drawings.

BRIEF DESCRIPTION OF THE DRAWINGS

FIGS. 2(a), 2(b) and 2(c) show a switch part of the same embodiment. Of these figures, FIG. 2(a) is an oblique view of the switch part while

FIGS. 3(a), 3(b) and 3(c) show an LED part of the same embodiment. Of the figures.

FIGS. 7(i a) and 7(b) are sectional views showing the connector part of the first embodiment and the connector part of the body in a state of being fittingly connected with each other.

Figure 1:
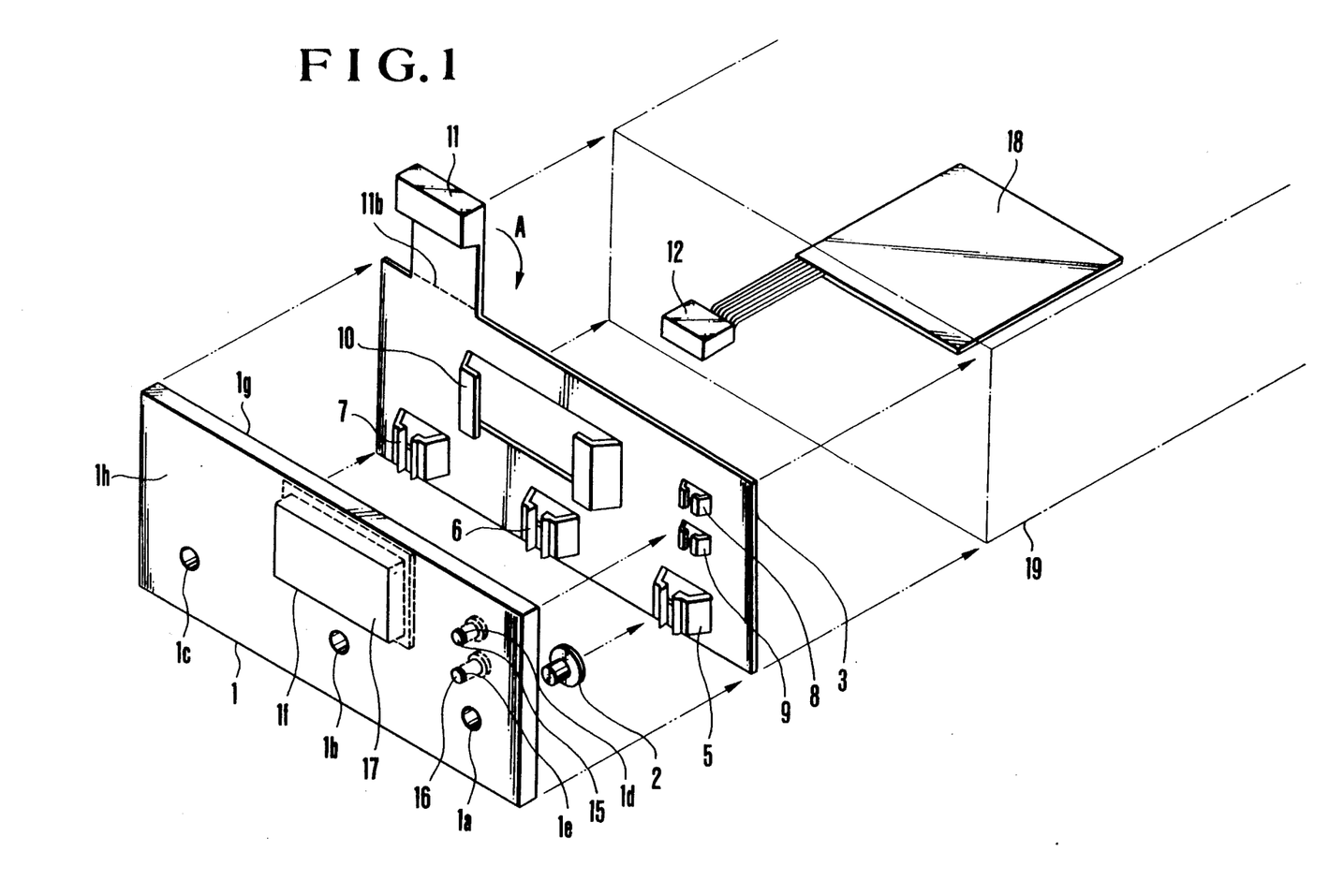
FIG. 1 is an exploded oblique view showing the operation device for an electronic apparatus which is arranged as a first embodiment of this invention.

DETAILED DESCRIPTION OF THE PREFERRED EMBODIMENTS:

Some embodiments of this invention are described below with reference to the accompanying drawings:

A first embodiment of the invention is arranged as follows: Referring to FIG. 1, an indication board 1 which is arranged as a front panel is provided with three switch-key holes 1a, 1b and 1c, two LED holes 1d and 1e and one LCD hole 1f. Three switch keys 2 (two of them are not shown), two LEDs 15 and 16 and one LCD 17 are arranged to be inserted respectively into these holes, which are formed in predetermined positions.

A frame 3 is made of a material which is elastic and flexible. The frame 3 is provided with three switch parts 5, 6 and 7, two LED parts 8 and 9 and one LCD part 10. These parts are formed in positions corresponding to the above-stated electric elements respectively. The frame 3 is further provided with a connector part 11 which extends upward, as viewed on the drawing, from the upper edge of the frame 3. Although it is not shown, an electric wiring to which the above-stated electric elements are electrically connected is formed on the surface of the frame 3 (on the front side or on both sides) either by printing a conductor or by molding it in one body with the frame 3.

The frame 3 is secured to the indication board 1 at a suitable distance away from the reverse side 1g of the indication board 1 and is mounted on the body 19 of an electronic apparatus together with the indication board 1.

Figure 2A:
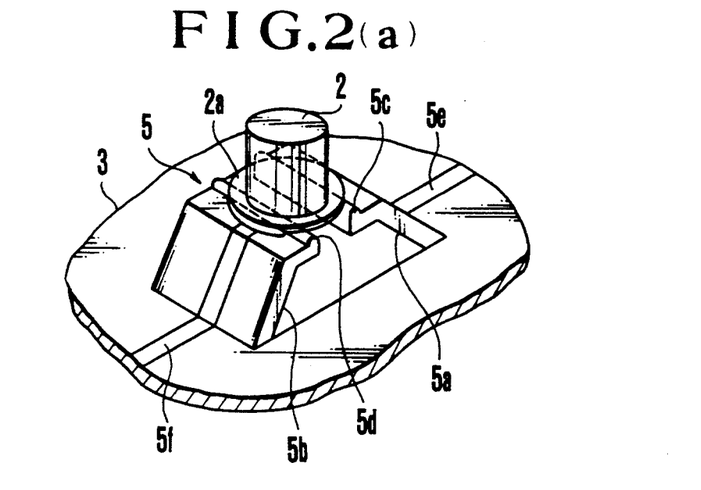
Figure 2B:
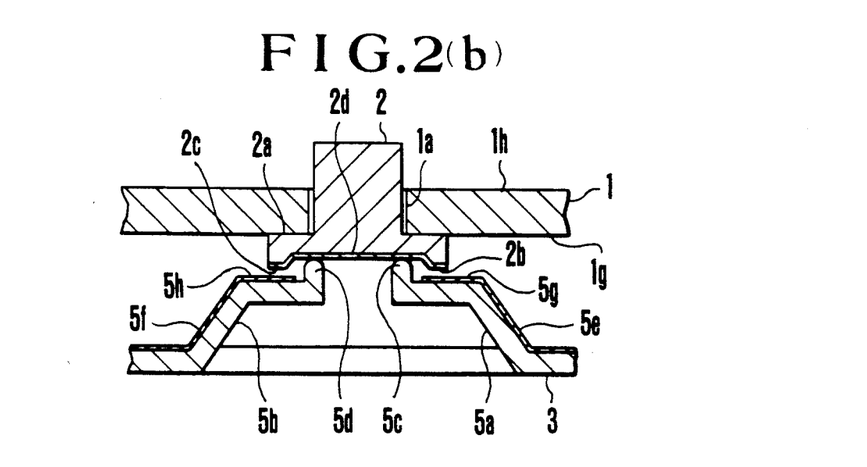
FIGS. 2(b) and 2(c) are sectional views.

Next, the details of each of the above-stated parts are described as follows:

FIGS. 2(a) and 2(b) show the switch key 2, the switch part 5, etc. The switch key 2 has a flange part 2a formed at one end of a cylindrical part in one body with the latter. The switch key 2 is thus arranged to have the cylindrical part slidably inserted from on the side of the frame 3 into the switch-key hole 1a of the indication board 1 and to have the flange part 2a supported on the reverse side 1g of the indication board 1.

A switch-key conductor 2d is provided on one side of the flange part 2a of the switch key 2 which is opposed to the frame 3. The switch-key conductor 2a is either printed on or molded in one body with the flange part 2a. A pair of abutting conductor parts 2b and 2c which extrude toward the frame 3 are formed in the peripheral parts of the flange part 2a and are opposed to each other diametrically across the flange part 2a.

Each of the switch parts 5 has a pair of switch pushing plates 5a and 5b. These plates 5a and 5b are elastic pressing members which are formed in a cut-and-bent-up shape in one body with the switch part 5. Each of the switch pushing plates 5a and 5b has a slanting part which obliquely extends from a suitable part of the frame 3 toward the indication board 1 in a state of confronting the slanting part of the other plate and a parallel part which is bent and extends from the slanting part in parallel to the indication board 1. At the fore ends of these parallel parts are formed protrudent edges 5c and 5d which protrude toward the indication board 1 respectively.

The protrudent edges 5c and 5d abut on the switch-key conductor 2d at parts located on the radially inner sides of the pair of abutting conductor parts 2b and 2c. The switch-key conductor 2d is thus pushed from the frame 3 toward the indication board 1 by the resilient forces of the switch pushing plates 5a and 5b in such a way as to have the flange part 2a supported on the reverse side 1g of the indication board 1.

On the surface parts of the switch pushing plates 5a and 5b which extend on the side of the indication board 1, from the roots of the protrudent edges 5c and 5d to the frame 3, there are provided a pair of switch conductors 5e and 5f which are electrically connected to the above-stated electric wiring of the frame 3. Each of these switch conductors 5e and 5f is either printed or molded in one body with the switch pushing plates 5a and 5b which confront the above-stated abutting conductor and 5f which confront the above-stated abutting conductor parts 2b and 2c are arranged as a pair of abutting conductor parts 5g and 5h.

Figure 2C:
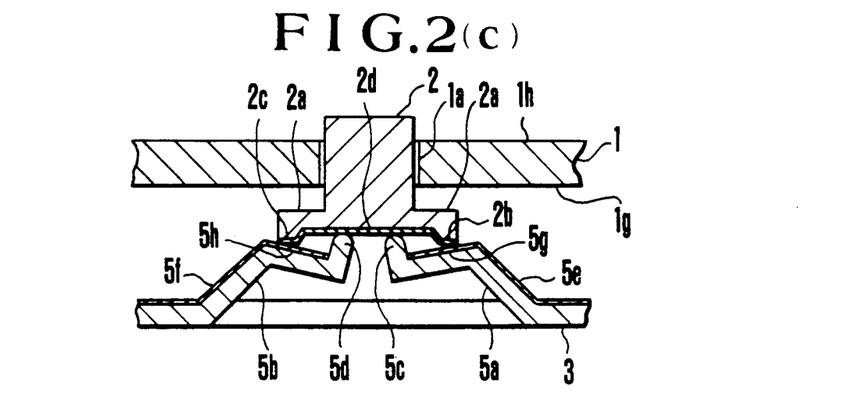

FIG. 2(c) shows the switch key 2 in a state of having been pushed against the resilient forces of the switch pushing plates 5a and 5b from the indication board 1 toward the frame 3. Each of the switch pushing plates 5a and 5b warps to allow the abutting conductor parts 2b and 2c to abut on the corresponding abutting conductor parts 5g and 5h. Under this condition, the pair of switch conductors 5e and 5f are conductive through the switch-key conductor 2d.

Other switch parts 6 and 7 and other switch keys not shown) are arranged in the same manner as the arrangement described above respectively and are, therefore, omitted from description.

Figure 3A:
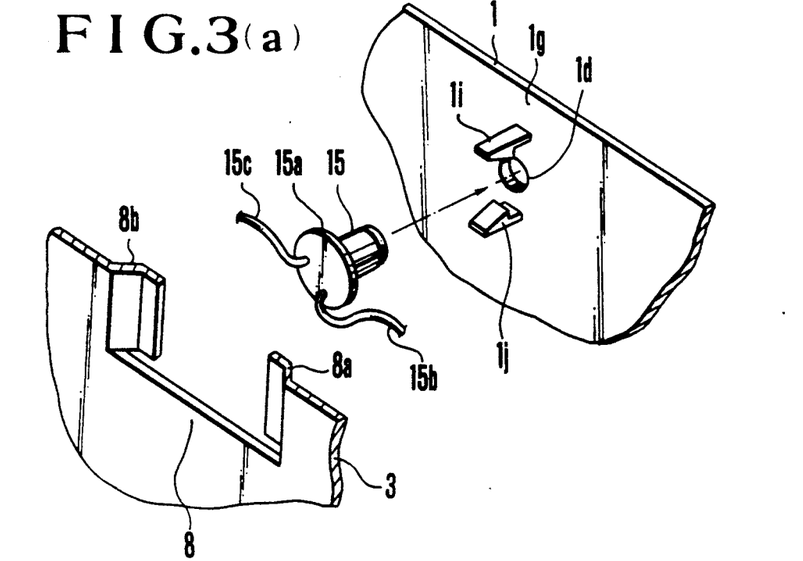
FIG. 3(a) is an exploded oblique view.
Figure 3B:
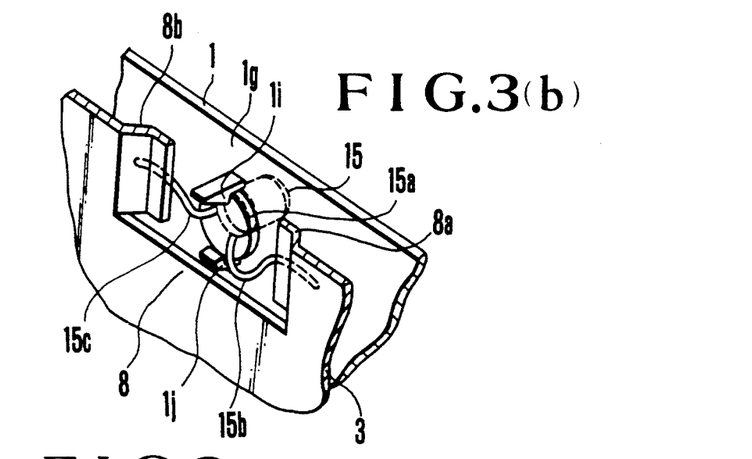
FIG. 3(b) is an oblique view showing an assembled state.
Figure 3C:
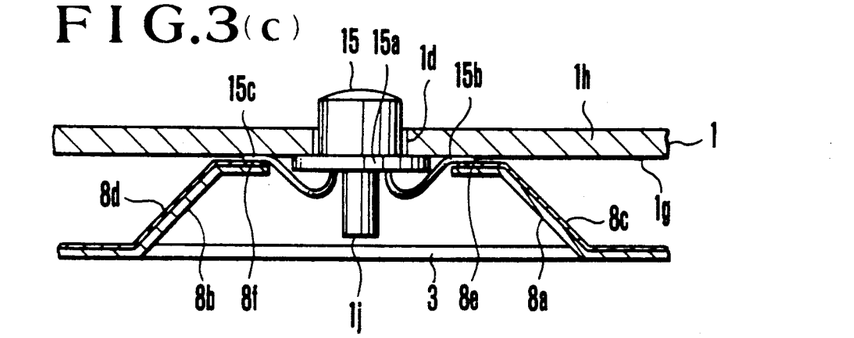
FIG. 3(c) is a sectional view.

Next, the details of the LED 15 and the LED part 8 are as described below:

As shown in FIGS. 3(a), 3(b) and 3(c), the LED 15 has a cylindrical part. A disc-like flange part 15a is formed at one end of the cylindrical part in one body with the latter. The LED 15 is fixed in position with the cylindrical part inserted from on the side of the frame 3 into the LED hole 1d of the indication board 1 and with the flange part 15a sandwiched between the reverse side 1g of the indication board 1 and two fixed claws 1i and 1j which are provided on the reverse side 1g. A pair of lead wires 15b and 15c which serve as the electrical terminal of the LED 15 extend from the rear end face of the LED 15 along the reverse side 1g of the indication board 1.

Meanwhile, a pair of LED pushing plates 8a and 8b which are pressing members are formed in one body with the LED part 8 of the frame 3 in a cut-and-bent-up shape. Each of the LED pushing plates 8a and 8b consists of a slanting part which obliquely extends from a suitable part of the frame 3 and is in a state of being opposed to the slanting part of the other pushing plate, and a parallel part which is bent and extends from the slanting part in parallel to the indication board 1.

A pair of LED conductors 8c and 8d which are electrically connected to the above-stated electrical wiring of the frame 3 are formed on the surfaces of the LED pushing plates 8a and 8b from their fore ends to the frame 3, on the side of the indication board 1, either by printing or by molding them in one body with these plates 8a and 8b. The surface parts of the LED conductors 8c and 8d which are opposed to the above-stated lead wires 15b and 15c are arranged to serve as a pair of pushing conductor parts 8e and 8f.

The above-stated LED pushing plates 8a and 8b are arranged to push the lead wires 15b and 15c of the LED 15 from the frame 3 toward the indication board 1 while causing the pushing conductor parts 8e and 8f to abut on the lead wires 15b and 15c and, at the same time, to make an electrical connection.

The other LED 16 and the other LED part 9 are arranged in the same manner as the above-stated arrangement and, therefore, omitted from description.

Figure 4:
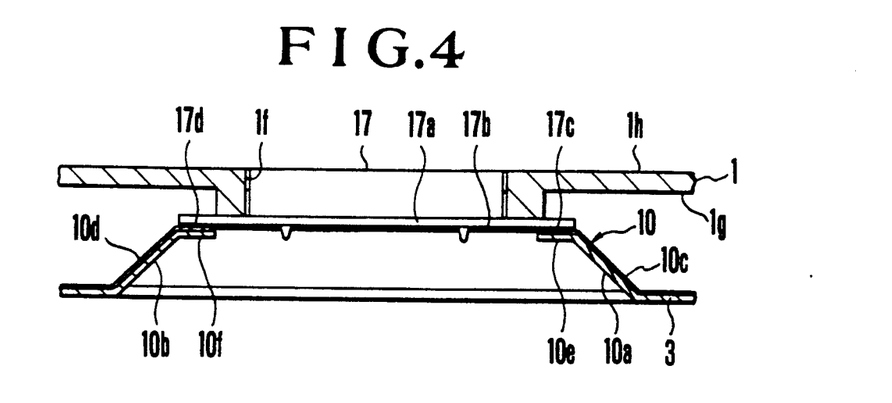
FIG. 4 is a sectional view of an LCD part of the same embodiment.

The LCD 17 and the LCD part 10 are arranged as follows: Referring to FIG. 4, an LCD-control circuit board 17a is soldered to the LCD 17. The LCD 17 is arranged in such a shape as to have the peripheral edge of the LCD-control circuit board 17a supported on the reverse side 1g of the indication board 1 with the LCD 17 inserted from on the side of the frame 3 into the LCD hole 1f. Element conductor parts 17c and 17d which are the electrical terminals of the LCD 17 are respectively formed, as shown in FIG. 4, at both end parts of a conductor pattern 17b, which is formed on the reverse side of the LCD-control circuit board 17a.

A pair of LCD pushing plates 10a and 10b which are pressing members are arranged in a shape similar to those of the LED part 8 shown in FIGS. 3(a), 3(b) and 3(c). A pair of LCD conductors 10c and 10d are electrically connected to the above-stated electrical wiring of the frame 3. Pushing conductor parts 10e and 10f which are respectively formed at the fore ends of the LCD conductors 10c and 10d are also arranged in the same manner as the LED part 8 described in the foregoing. The LCD pushing plates 10a and 10b are arranged to have the LCD 17 secured to the indication board 1 with the pushing conductor parts 10e and 10f pushed to abut on the element conductor parts 17c and 17d of the LCD 17 from the frame 3 toward the indication board 1 and, at the same time, to make electrical connection.

Figure 5:
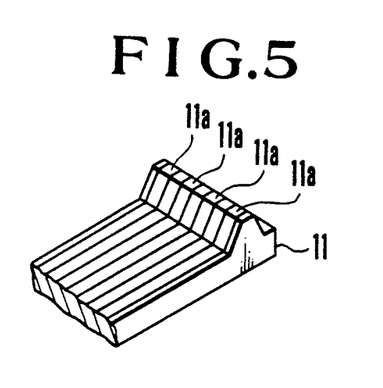
FIG. 5 is an oblique view showing a connector part of the same embodiment.
Figure 6:
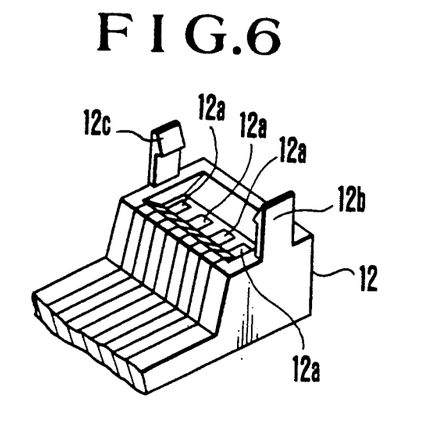
FIG. 6 is an oblique view showing a connector part disposed on the side of the body of the electronic apparatus.

Referring to FIGS. 5 and 6, the connector part 11 consists of a bent part 11b which protrudes from the upper edge of the frame 3, as shown in FIG. 1, and a protruding part which is formed at the fore end part of the bent part 11b in such a shape as to fittingly engage the connector part 12 which is formed on the side the apparatus body 19. Connector conductor parts 11a which are electrically connected to the above-stated electrical wiring of the frame 3 are either printed on or molded in one body with the surface of the connector part 11 on its side on which it abuts on the conductor 12a of the connector part 12 disposed on the apparatus body 19.

Figure 7A:
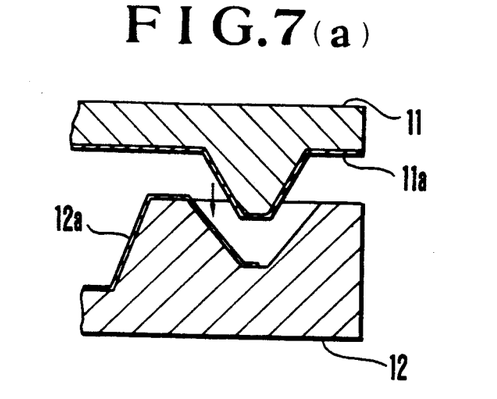
Figure 7B:
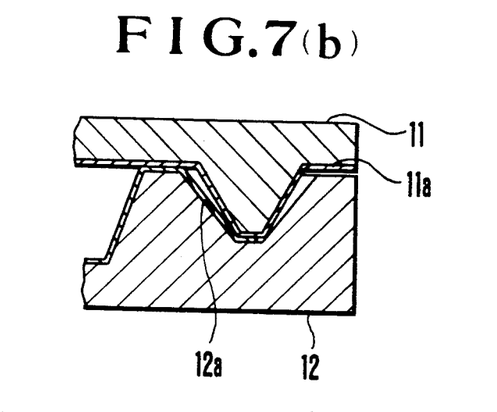

The connector part 11 is secured to the apparatus body connector part 12 by means of two fixed claws 12b and 12c. Referring to FIGS. 7(a) and 7(b), the connector conductor part 11a is thus arranged to abut on the conductor 12a which is electrically connected to an internal electronic circuit 18 (see FIG. 1). An electrical connection is established by this. Further, in mounting the operation device on the electronic apparatus body 19, the connector part 11 is bent in the direction of arrow A as shown in FIG. 1.

Figure 8:
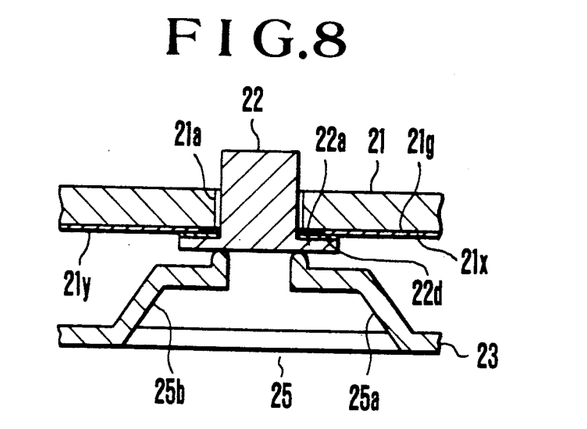
FIG. 8 is a sectional view showing a switch part of a second embodiment of the invention.

Next, a second embodiment of the invention is arranged as follows: The switch part 5 of the first embodiment is a push-button switch which is arranged to close a circuit when the switch key 2 is pushed down. In the case of the second embodiment, however, this push-button switch arrangement is replaced with the following arrangement: Referring to FIG. 8, an annular switch-key conductor 22d is provided on the upper side of the flange part 22a of a switch key 22, as viewed on FIG. 8. A pair of indication-board conductors 21x and 21y which are connected to the electric wiring of a frame 23 are separately arranged on the reverse side 21g of the indication board 21 in such parts of the board 21 where the switch-key conductor 22d comes to abut on them. A push-button switch is thus arranged to open a circuit when the switch key 22 is pushed. A plurality of such push-button switches may be arranged in any desired number. With the exception of the above-stated point, the second embodiment is arranged in exactly the same manner as in the case of the first embodiment. The rest of the second embodiment is, therefore, omitted from description.

Figure 9:
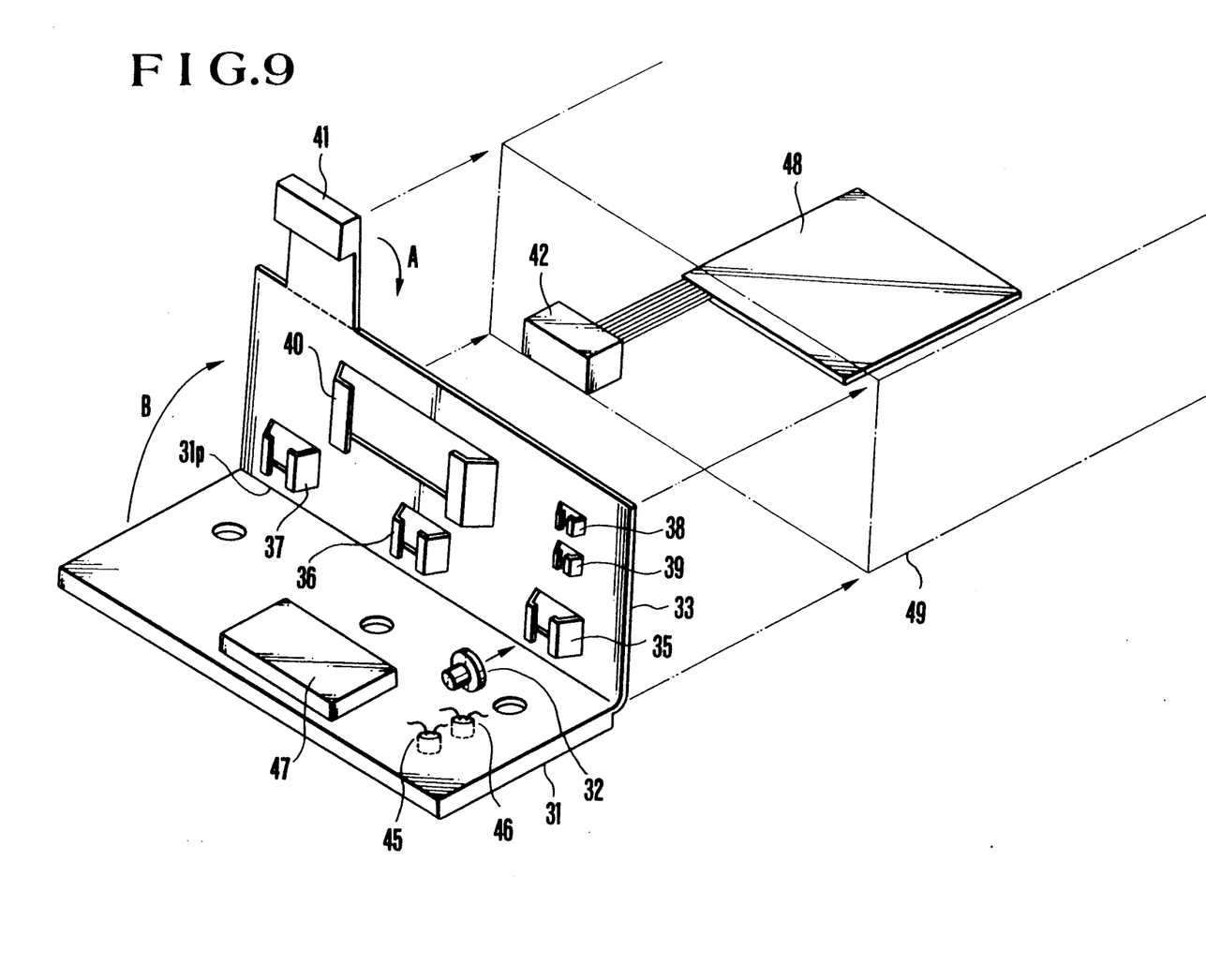
FIG. 9 is an exploded oblique view showing a third embodiment of the invention.

The following describes a third embodiment:

In each of the embodiments described above, the indication board and the frame are arranged in separate bodies. Whereas, in the case of the third embodiment, an indication board 31 and a frame 33 are molded in one body, as shown in FIG. 9, with a bent part 31p such as a groove formed between them. The frame 33 is bent in the direction of arrow B and is thus in a state of being secured to the indication board 31. With the exception of this, the rest of the third embodiment is identical with the first embodiment described in the foregoing and is, therefore, omitted from description.

The arrangement according to this invention as described in the foregoing gives the following advantages:

A plurality of electric elements can be individually arranged in their predetermined parts of the indication board beforehand. This greatly facilitates the positioning work on them to permit the positioning work to be carried out with a greater degree of precision. Further, unlike the conventional device, the invention obviates the necessity of the soldering work on the abovestated electric elements. Therefore, the process of assembly work can be simplified.

What is claimed is:

1. An operation device for an electronic apparatus, comprising:
    an electronic apparatus body having an electronic circuit;
    an exterior board disposed on a surface of said electronic apparatus body, said exterior board having a plurality of holes therein;
    a frame interposed between said exterior board and said electronic apparatus body, said frame having a conductive part which is electrically connected to said electronic circuit of said electronic apparatus body and a plurality of elastic parts which protrude to a position corresponding to the holes in said exterior board; and
    a plurality of different kinds of electric elements which are inserted between said exterior board and said protruding elastic parts of said frame and are arranged to be carried by a resilient force of said elastic parts between said exterior board and said frame, said electric elements being partly inserted in the holes of said exterior board, wherein
    said different kinds of electric elements have different heights, and a gap between said exterior board and said frame is made uniform when said exterior board, said frame and said electric elements are assembled, and said electric elements include a switch key which has a conductor part, said switch key conductor part being arranged to come into electrical contact with said conductive part of said frame when said switch key is operated against the resilient force of said elastic part.

2. A device according to claim 1, wherein said plurality of kinds of electric elements include liquid crystal devices.

* * * * *

UNITED STATES PATENT AND TRADEMARK OFFICE
CERTIFICATE OF CORRECTION

PATENT NO. : 5,241,145
DATED : August 31, 1993
INVENTOR(S) : Kawade

It is certified that error appears in the above-indentified patent and that said Letters Patent is hereby corrected as shown below:

On the title page, Item [56] References Cited: "Tachibara" should read —Tachibana—.

Column 2, lines 37, "FIGS. 7(i a)" should read —FIGS. 7 (a)—.

Signed and Sealed this

Thirty-first Day of May, 1994

Attest:

BRUCE LEHMAN

*Attesting Officer*  *Commissioner of Patents and Trademarks*